Patent Number: 5,412,224
Date of Patent: May 2, 1995

United States Patent [19]
Goronkin et al.

[54] FIELD EFFECT TRANSISTOR WITH NON-LINEAR TRANSFER CHARACTERISTIC

[75] Inventors: Herbert Goronkin, Tempe; Jun Shen, Phoenix; Saied Tehrani, Scottsdale, all of Ariz.

[73] Assignee: Motorola, Inc., Schaumburg, Ill.

[21] Appl. No.: 894,989

[22] Filed: Jun. 8, 1992

[51] Int. Cl.⁶ ............... H01L 29/161; H01L 29/205; H01L 29/225
[52] U.S. Cl. ........................................ 257/15; 257/20
[58] Field of Search ................. 257/16, 15, 20

[56] References Cited

U.S. PATENT DOCUMENTS

| | | | |
|---|---|---|---|
| 4,195,305 | 3/1980 | Moon | 357/16 |
| 4,207,122 | 6/1980 | Goodman | 148/33.4 |
| 4,793,951 | 5/1988 | Chang et al. | 357/22 |
| 4,806,993 | 2/1989 | Voisin et al. | 357/4 |

FOREIGN PATENT DOCUMENTS

| | | | |
|---|---|---|---|
| 59-63769 | 4/1984 | Japan | 357/22 |
| 59-100577 | 6/1984 | Japan | 357/22 |
| 60-263472 | 12/1985 | Japan | 357/22 |
| 62-45064 | 2/1987 | Japan | 357/16 |

OTHER PUBLICATIONS

Sercel et al, 'Type two broken gap quantum wires...', *App Phys lttr*, 57(15), pp. 1569–1571, 8 Oct. 90.
Beresford et al, 'Interband tunneling... heterostructures', *Appl Phys Lttr* 56(10), pp. 952–954, 5 Mar. 90.
Zhu et al, 'Exitonic Insulator Transition...', *Solid State Comm*, vol. 75 No. 7, pp. 595–599, 1990.

*Primary Examiner*—Andrew J. James
*Assistant Examiner*—Stephen D. Meier
*Attorney, Agent, or Firm*—Aaron B. Bernstein

[57] ABSTRACT

A field effect semiconductor device having multiple vertically stacked channels (12, 14, 16) separated by barrier layers comprising wide bandgap material (18) is provided. The channels (12, 14, 16) are formed on a wide bandgap buffer layer (11) and each channel is coupled a N-type drain region (22b). Each channel is also coupled to an N-type source region (25b). With appropriate gate bias on a gate electrode (17), quantized energy levels in the channels (12, 14, 16) are aligned to provide self-doping by electrons in the valence band of the P-channel (14) moving to the conduction band of the N-channels (12, 16) providing peak channel conductivity. At higher gate bias, one of the N-channels (12) becomes non-conductive creating a negative resistance region.

10 Claims, 3 Drawing Sheets

FIELD EFFECT TRANSISTOR WITH NON-LINEAR TRANSFER CHARACTERISTIC

BACKGROUND OF THE INVENTION

This invention relates, in general, to semiconductor devices, and more particularly, to a self-aligned field effect transistor having a highly non-linear transfer characteristic.

Semiconductor devices that have non-linear current-voltage characteristics allow greater functionality to be incorporated into smaller devices. Such devices are referred to herein as "multi-functional" devices. In recent years, a few multi-functional devices have been developed. Examples of such devices include Esaki diodes and resonant tunneling diodes. Most of these devices take advantage of the negative differential resistance that is caused by resonant tunneling of electrons.

Even more useful for digital logic applications than non-linear diodes would be non-linear three terminal devices which provide gain. Resonant tunneling hot electron transistors and bipolar resonant tunneling transistors, are examples of currently available three terminal devices. Even though these devices show some nonlinear characteristics, the observed non-linearitites are small at room temperature and the performance improves at liquid nitrogen temperatures or below. Currently available devices also have bipolar transistor characteristics with very complicated and nonplanar processes, and consume high standby power.

What is needed is a room temperature field effect transistor with highly nonlinear current-voltage characteristics that consumes low power.

SUMMARY OF THE INVENTION

Briefly stated, the advantages of the present invention are achieved by a field effect semiconductor device having two N-channel quantum wells coupling an N-type source region and an N-type drain region. Conductivity of each of the channels is controlled by a gate electrode. The device includes a P-type quantum well and two N-type quantum wells formed on opposite sides of the P-type layer and separated from the P-type layer by barrier layers comprising a wide bandgap material. The P-type quantum well has a valence band energy greater than the conduction band energy of the N-type quantum wells. Each of the N-channel quantum wells is conductive at a different gate bias resulting in a non-linear transfer characteristic.

DETAILED DESCRIPTION OF THE DRAWINGS

Figure 1:
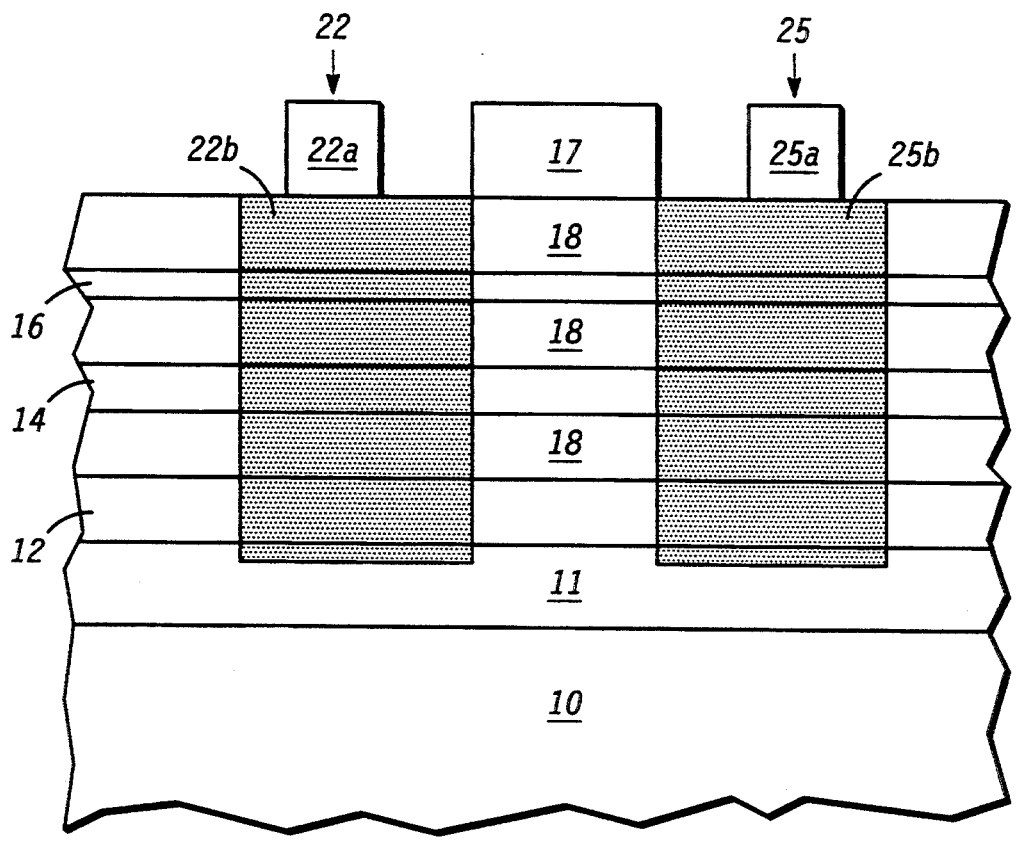
FIG. 1 illustrates a highly simplified cross section through a portion of a field effect device having a non-linear transfer characteristic made in accordance with the present invention.

A primary concern in design of quantum well field effect transistors is the structure of the channel regions underneath the gate electrode as the channel region performance largely determines overall performance of the transistor. FIG. 1 illustrates highly simplified cross-section through a channel region of a field effect transistor in accordance with the present invention. All material layers shown in FIG. 1 are substantially single crystal epitaxially grown layers. This requires that each epitaxial layer comprise a material which is crystallographically compatible with an underlying substrate. Therefore, in addition to electronic material constraints discussed hereinafter in regard to the particular embodiments, it should be noted that material choice is also limited by crystal properties. The epitaxial layers of the present invention may be grown by metal organic chemical vapor deposition (MOCVD), molecular beam epitaxy (MBE), or atomic layer epitaxy (ALE), or the like.

The embodiment shown in FIG. 1 includes a wide band gap buffer layer 11 comprising a material such as aluminum antimonide (AlSb) or aluminum gallium antimonide (AlGaSb) formed on a supporting crystalline substrate 10 such as semi-insulating gallium arsenide. Other wide band gap materials are known and used in compound semiconductor devices, but, as will be seen, AlSb is desirable in the preferred embodiments to ensure compatibility with other materials used in overlying layers of the preferred embodiments.

A first N-channel quantum well 12 is formed on top of buffer 11 and covered by a first barrier layer comprising a wide bandgap material 18. First N-channel quantum well 12 comprises InAs and is in the range of at least ten nanometers thick.

A P-channel quantum well 14 is formed covering first barrier layer 18. In a preferred embodiment, P-channel quantum well 14 is in the range of five to twenty nanometers thick comprises gallium antimonide (GaSb). P-channel quantum well 14 can be doped directly or by modulation doping techniques to improve conductivity if desired, but in a preferred embodiment remains undoped to maximize mobility. P-channel quantum well 14 is covered by a second barrier layer 18 having a thickness of approximately three nanometers and comprising a material with a wide band gap such as AlSb or AlGaSb.

A second N-channel quantum well 16 is formed above P-channel quantum well 14 and separated from p-channel quantum well 14 by a barrier layer 18. N-channel quantum well 16 is in the range of five to twenty nanometers thick and comprises a material such as indium arsenide (InAs) in the preferred embodiments. Another barrier layer 18 is formed over second N-channel quantum well 16 and serves as a cap layer because it is the uppermost barrier layer. This uppermost barrier layer 18 also comprises a wide band gap material such as AlSb or AlGaSb, and in the preferred embodiment is approximately ten nanometers thick. Desirably, N-channel quantum well 16 is substantially undoped and that no charge supply layer need be placed in the barrier layers to maximize mobility and increasing efficiency of the channels.

Gate electrode 17 comprises a conductive material positioned on an upper surface of barrier layer 18. Gate electrode 17 makes Schottky contact to the uppermost barrier layer 18. An N-type drain region 22b extends from the surface of the uppermost barrier layer 18 through N-channel quantum well 16, intermediate barrier layer 18, and P-channel quantum well 14. Drain region 22b is formed by conventional doping and diffusion techniques such as ion implantation and thermal activation/redistribution. An N-type source region 25b is formed on an opposite side of gate electrode 17, also using well known doping techniques. Preferably, gate electrode 17 serves as a mask for the formation of drain region 22b and source region 25b, simplifying manufacture of the device.

Subsequently, a drain conductor 22a is formed making ohmic contact to drain region 22b. Similarly, source conductor 25a is formed making ohmic contact to source region 25b. As used herein, drain electrode 22 includes both drain conductor 22a and drain region 22b, and source electrode 25 includes both source conductor 25a and source region 25b.

Figure 2:
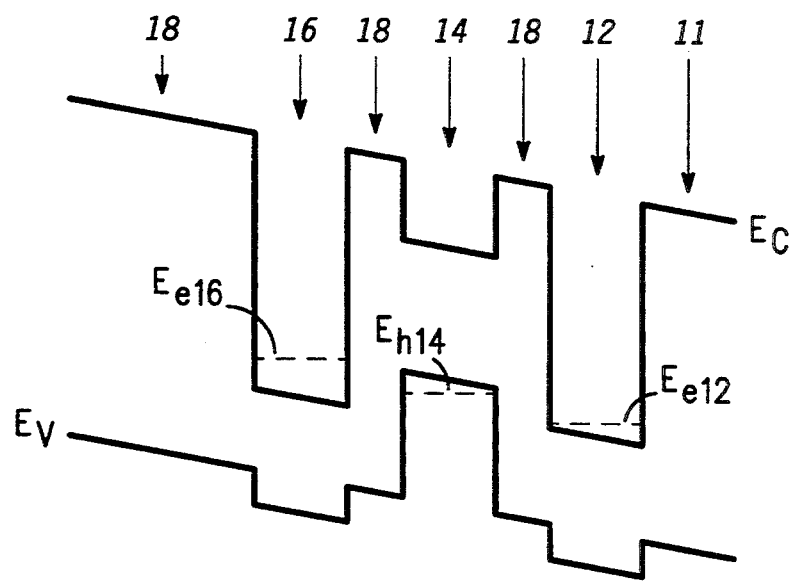
FIG. 2 illustrates a band diagram of the structure shown in FIG. 1 with no applied gate bias.
Figure 3:
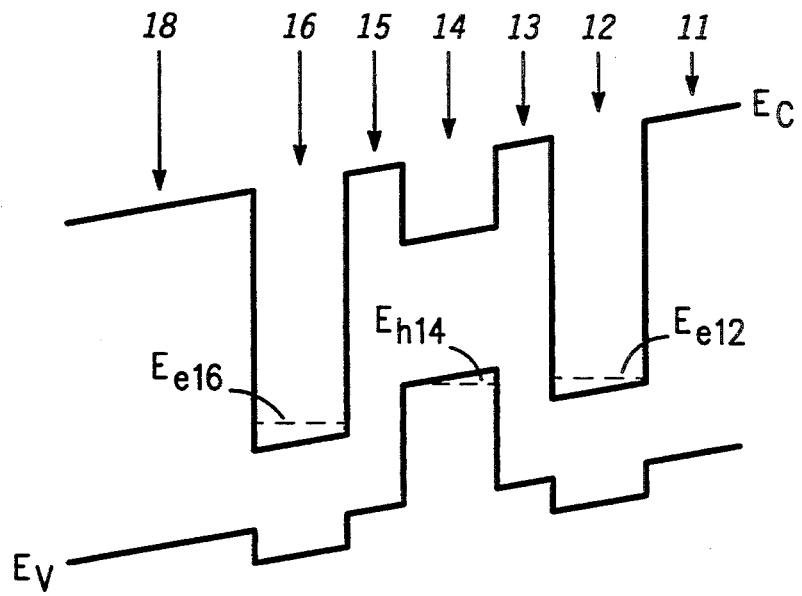
FIG. 3 illustrates a band diagram of the structure shown in FIG. 1 with first applied gate bias.
Figure 4:
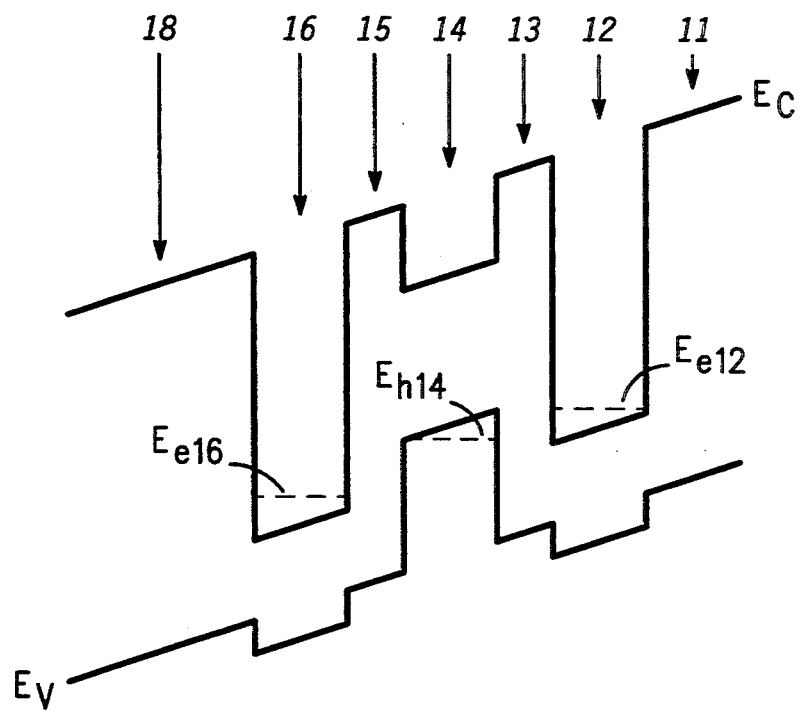
FIG. 4 illustrates a band diagram of the structure shown in FIG. 1 with second applied gate bias.

Operation of the device illustrated in FIG. 1 can be understood with reference to the bandgap diagrams shown in FIG. 2-FIG. 4. The particular materials for P-channel quantum well 14 and N-channel quantum well 16 are chosen because P-channel quantum well 14 must have a valence band energy greater than conduction band energy of N-channel quantum well 14 as will become more apparent. Conduction band energy ($E_c$) and valence band energy ($E_v$) are illustrated in bandgap diagrams shown in FIG. 2-FIG. 4. In FIG. 2-FIG. 4, the vertical axis represents relative energy in electron volts, and the horizontal axis represents thickness or depth within the device structure shown in FIG. 1. The left hand side of the drawings is upper surface, while the right hand side of the drawings is buffer layer 11.

N-channel quantum wells 12 and 16 and P-channel quantum well 14 are separated from each other by wide band gap barriers 18. A quantized energy level for a first hole state ($\epsilon_{h14}$) exists in P-channel quantum well 14 and is indicated by a dashed line within quantum well 14. $\epsilon_{h14}$ lies at an energy somewhat lower than valence band energy for P-channel quantum well 14. The precise energy for $\epsilon_{h14}$ is determined by thickness of quantum well 14. $\epsilon_{h14}$ is the minimum energy for holes in P-channel quantum well 14.

Likewise, $\epsilon_{e12}$ and $\epsilon_{e16}$ indicate a quantized energy level for a first electron state in N-channel quantum wells 12 and 16 respectively. $\epsilon_{e12}$ and $\epsilon_{e16}$ lie somewhat above conduction band energy for N-channel quantum wells 12 and 16 and are also determined by thickness of N-channel quantum wells 12 and 16. $\Delta\epsilon$ is an energy difference between valence band energy in P-channel quantum well 14 and conduction band energy in N-channel quantum wells 12 and 16. When GaSb and InAs are used for the quantum wells, $\Delta\epsilon$ is about 0.175 eV.

As noted hereinbefore, $\epsilon_{e12}$, $\epsilon_{e16}$, and $\epsilon_{h14}$ vary with thickness of the quantum wells. For example, as P-channel quantum well 14 become thinner, $\epsilon_h$ becomes more separated from $E_v$. Likewise, as N-channel quantum wells 12 and 16 become thinner, $\epsilon_{e12}$ and $\epsilon_{e16}$ become more separated from $E_C$. This aspect of the self doping structure shown in FIG. 1 can be used to create HFET structures having both depletion mode and enhancement mode characteristics. The thickness of barriers 18 is designed to allow overlap between the electron wave function in N-channel quantum wells 12 and 16 and the hole wave function in adjacent P-channel quantum well 14. In other words, barriers 18 are thin enough that charge carriers can couple between P-channel quantum well 14 gates and the adjacent N-channel quantum wells.

In operation, voltage is applied to gate electrode 17 which alters the bandgap relationship by raising or lowering the energy bands of quantum wells located nearer the surface with respect to those quantum well positioned farther from the surface. FIG. 2 illustrates this operation with no bias applied to gate electrode 17. Under zero bias, $\epsilon_{h14}$ is greater than $\epsilon_{e12}$ so that electrons in the valence band of P-channel quantum well 14 prefer the conduction band of second N-channel quantum well 12. Although this condition creates free charge carriers in both N-channel 12 and P-channel 14, these free charge carriers are initially depleted by the Schottky contact potential created by gate electrode 17. N-channel quantum well 16 remains undoped because $\epsilon_{e16}$ is greater than $\epsilon_{h14}$. Thus, with zero bias all three channels remain empty or depleted of carriers, and are non-conductive. This is represented by condition "A" on the current voltage characteristic shown in FIG. 5.

As bias is applied to gate electrode 17, the relative band energies shift as shown in FIG. 3. Here, positive bias on gate electrode 17 aligns the bands so that $\epsilon_{h14}$ aligns with $\epsilon_{e12}$ and $\epsilon_{e16}$. In this case, both N-channels 12 and 16 are filled with electrons from the valence band of P-channel 14. Moreover, the valence band of P-channel 14 becomes filled with holes due to the departure of electrons to N-channels 12 and 14. At the gate bias where $\epsilon_{e12}$, $\epsilon_{h14}$, and $\epsilon_{e16}$ are in alignment, a high peak current is achieved from drain region 22b to source region 25b, indicated by point "B" in FIG. 5. Electrons travel from drain region 22 through N-channel quantum wells 12 and 16.

Alternatively, thicknesses of N-channels 12 and 14 can be designed so that they do not align with $\epsilon_{h14}$ simultaneously. In this case, peak current will not be as high because only one channel is carrying charge. On the other hand, this design results in more non-linear output as a first peak current occurs when $\epsilon_{h14}$ aligns with $\epsilon_{e12}$ as shown at point B in FIG. 5, and a second peak current occurs (not shown) when $\epsilon_{h14}$ aligns with $\epsilon_{e16}$.

Figure 5:
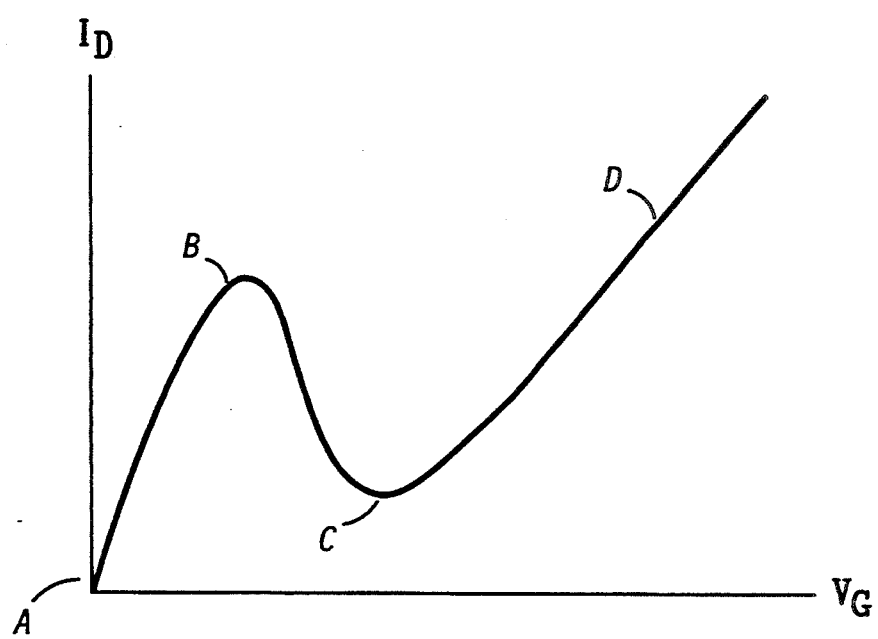
FIG. 5 illustrates a transfer characteristic for the device shown in FIG. 1.

As illustrated in FIG. 4, further gate bias results in $\epsilon_{e12}$ rising higher than $\epsilon_{h14}$, so that electrons in the conduction band of N-channel quantum wells 12 prefer the valence band of P-channel quantum well 14. This results in reduced charge in P-channel quantum well 14 and N-channel quantum well 12 which becomes essentially non-conductive. This point is illustrated in FIG. 5 at position "C" reflecting a sharp drop off in current at this gate bias. Position B to position C in FIG. 5 is a negative resistance regime where increased gate bias results in lower current. Finally, as the magnitude of gate bias is further increased, N-channel quantum well 16 begins to behave like a single channel field effect transistor, becoming increasingly conductive up to a saturation point determined by device geometries and doping. This bias is represented by region "D" in FIG. 5 illustrating a rise in current.

By now it should be appreciated that a field effect device with improved performance and non-linear transfer characteristic is provided. The multiple channel device structures in accordance with the present invention allows optimal use of superior materials for FET technology as well as highly non-linear output for improved functionality.

We claim

1. A field effect transistor with non-linear transfer characteristic comprising: a crystalline substrate; a buffer layer comprising a wide bandgap material formed on the substrate; a first N-channel quantum well of a first material composition formed on the buffer layer; a first barrier layer comprising the wide bandgap material covering the first N-channel quantum well; a quantum well of a second material composition formed on the first barrier layer; a second barrier layer comprising the wide bandgap material covering the quantum well of a second material composition; a second N-channel quantum well of a first material composition positioned over the second barrier layer, wherein the second material composition has a valence band energy greater than the conduction band energy of the first material composition; a cap layer comprising the wide bandgap material covering the second N-channel quantum well; a gate electrode positioned on top of the cap layer; an N-type drain region formed on one side of the gate electrode; and an N-type source region formed on an opposite side of the gate electrode, wherein the source and drain regions extend from an upper surface of the cap layer through the second N-channel quantum well, to the first N-channel quantum well to electrically couple the first and second N-channel quantum wells in parallel, wherein further any drain-to-source current flows in the first and second n-channel quantum wells and not in the quantum well of a second material composition.

2. The field effect transistor with non-linear transfer characteristic of claim 1 further comprising a drain conductor making ohmic contact to the drain region and positioned on the upper surface of the cap layer and a source conductor making ohmic contact to the source region and positioned on the upper surface of the cap layer.

3. The field effect transistor with non-linear transfer characteristic of claim 2 wherein the second material composition is gallium antimonide, the first material composition is indium arsenide, and the wide bandgap material comprises aluminum antimonide.

4. The field effect transistor with non-linear transfer characteristic of claim 3 wherein the quantum well of the second material composition is in the range of five to twenty nanometers thick.

5. The field effect transistor with non-linear transfer characteristic of claim 3 wherein the second N-channel quantum well is less than ten nanometers thick and the first N-channel quantum well is more than ten nanometers thick.

6. A field effect transistor with non-linear transfer characteristic comprising: a semi-insulating crystalline substrate; a buffer layer comprising a wide bandgap material covering the substrate;
   a first N-channel comprising a first narrow bandgap material covering a portion of the buffer layer; a first barrier comprising a wide bandgap material covering the first channel;
   a quantum well comprising a second narrow bandgap material covering the first barrier layer; a second barrier comprising the wide bandgap material covering the quantum well;
   a second N-channel comprising the first narrow bandgap material covering the second barrier layer; a third barrier comprising the wide bandgap material covering the second channel and serving as a cap layer;
   a gate electrode formed on an upper surface of the third barrier and making Schottky contact to the third barrier;
   an N-type drain region coupled to each of the N-channels on a first side of the gate electrode; and
   an N-type source region coupled to each of the channels on an opposite side of the gate electrode.

7. The field effect transistor with non-linear transfer characteristic of claim 6 further comprising a drain conductor making ohmic contact to the drain region and positioned on the upper surface of the cap layer and a source conductor making ohmic contact to the source region and positioned on the upper surface of the cap layer.

8. The field effect transistor with non-linear transfer characteristic of claim 6 wherein the first narrow bandgap material is indium arsenide, the second narrow bandgap material includes gallium antimonide, and the wide bandgap material includes aluminum antimonide.

9. The field effect transistor with non-linear transfer characteristic of claim 8 wherein the quantum well comprising the second narrow bandgap material is in the range of five to twenty nanometers thick.

10. The field effect transistor with non-linear transfer characteristic of claim 8 wherein the first N-channel quantum well is more than ten nanometers thick and the second N-channel quantum well in in the range of five to twenty nanometers thick.

* * * * *